(12) United States Patent
Braceras et al.

(10) Patent No.: US 6,392,949 B2
(45) Date of Patent: May 21, 2002

(54) HIGH PERFORMANCE MEMORY ARCHITECTURE

(75) Inventors: George M. Braceras, Essex Junction; Harold Pilo, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/761,460

(22) Filed: Jan. 16, 2001

Related U.S. Application Data

(60) Provisional application No. 60/180,882, filed on Feb. 8, 2000.

(51) Int. Cl.[7] .................................................. G11C 3/00
(52) U.S. Cl. ...................... 365/230.03; 365/51; 365/63
(58) Field of Search ........................... 365/230.03, 63, 365/52, 51

(56) References Cited

U.S. PATENT DOCUMENTS

| | | | |
|---|---|---|---|
| 4,928,265 A | 5/1990 | Higuchi et al. ........ 365/189.01 |
| 5,412,613 A | * 5/1995 | Galbi et al. .................... 365/63 |
| 5,642,323 A | * 6/1997 | Kotani et al. .................. 365/63 |
| 5,703,815 A | 12/1997 | Kuhara et al. ............... 365/194 |
| 5,943,285 A | * 8/1999 | Kohno ......................... 365/63 |
| 6,064,621 A | * 5/2000 | Tanizaki et al. ............... 365/63 |

FOREIGN PATENT DOCUMENTS

| | | |
|---|---|---|
| JP | 59-22289 | 2/1984 |
| JP | 1-98191 | 4/1989 |
| JP | 8-306183 | 11/1996 |

* cited by examiner

Primary Examiner—Tan T. Nguyen
(74) Attorney, Agent, or Firm—Robert A. Walsh

(57) ABSTRACT

A high performance memory array architecture is provided to minimize the delays within each array. The architecture of the array equalizes the access time to all memory elements by optimizing the positioning of the subarrays with respect to buffering and rebuffering elements used in the array which cause delays.

5 Claims, 2 Drawing Sheets

HIGH PERFORMANCE MEMORY ARCHITECTURE

This application claims benefit of provisional No. 60/180,882 filed Feb. 8, 2000.

BACKGROUND OF THE INVENTION

1. Field of the Invention

The present invention relates to a high-performance semiconductor memory architecture and, in particular, to a high performance architecture of a Static Random Access Memory (SRAM) cell.

2. Description of the Related Art

In these years, the operation speed and the integration density of the integrated circuit have been significantly improved, along with the miniaturization of the semiconductor elements. Particularly, BiCMOS LSI which employs the combination of CMOS FETs and bipolar transistors and enabling high speed operation and low power dissipation, is being developed.

This trend is ascribed to the recent tendency of high speed and high function of electronics instruments.

Miniaturization of semiconductor elements has been advanced to respond to this requirement. Fine pattern processings, however, need corresponding facilities and equipments. It is, hence, not easy to rapidly develop the fine pattern processings. Thus, attempts have been performed to enhance the high speed operation by the expedients in the circuit design. For example, high speed memory circuits unitizing pipeline systems were proposed and fabricated. The pipeline system performs reading and writing of information at a shorter time interval than the information read time of the memory circuit (address access time: time from the input of an information read signal to the output of a recorded information from a memory cell, hereinafter referred to as access time), by dividing the operation of the memory circuit along the signal flow and operating the respective circuits independently.

Later, an improved pipeline technique known as a "wave-pipeline technique" was proposed for further enhancing the operational frequency of the conventional pipeline technique. In the wave-pipeline technique, a plurality of signals are propagated on the data path as-wave signals. With this technique, an operation which is equivalent to a conventional two-stage pipeline technique is realized without interference and with a reduction in the power dissipation and the chip area.

In the wave-pipeline technique, the operational speed of the system is improved without using intermediate registers or latch circuits. That is, a plurality of coherent data waves are aligned in sequence in the combination circuit by feeding clock signal to flip-flops at a rate higher than the propagation delay time of the combinational circuit. That is, if all the signal paths for signal components of a wave signal extending from the input to the output of the combinational circuit have a substantially equal delay, the individual wave signals can be propagated toward the output section without an interference between the wave signals.

If address signals are applied to a data path with a cycle time which exceeds an access time, read-out data is not output during the self-delay of the memory core. In the memory system of the wave-pipeline technique, address input signals are applied with a period which is less than the critical path of a memory core section.

A key to implementing the wave-pipeline technique on the semiconductor memory system lies in reducing difference in the signal delay time which is caused by different locations of memory cells being accessed or that caused by a difference between data path lengths.

It is to be noted that in a memory system of a large capacity, a refinement in the process results in a reduced metal film thickness, and a reduction in size of a memory cell also results in a reduced metal line width.

As the capacity increases, there is a tendency that signal wiring and bit lines, which use metal, increase. This means that a resistance presented by the signal wiring and the bit line increases, posing a problem in that a signal delay time caused by the signal wiring and the bit lines increases as does a difference in the signal delay time caused by differences of data paths.

Static Random Access Memory (SRAM) devices are comprised of a rectangular matrix of memory cells. Individual memory cells are accessed by the intersection of decoded row and column addresses. Because the SRAM receives these addresses in only one input location, it follows that some memory elements are close to the input while others are farther away from the input. Or, in terms that are important to high performance memories, there are fast memory elements and slow memory elements within the SRAM. Normally, this is not an issue because the speed of the SRAM is dictated by the slowest cells, and the fastest cells meet the specifications with margin. As SRAM densities and performance increase, the speed difference between the fast and slow elements can become a significant percentage of the cycle time of the memories and start to impact performance. This will become evident by reviewing the operation of a conventional SRAM and considering the differences between an access to a slow memory element and an access to a fast memory element in a typical prior art SRAM design shown in FIG. 1.

FIG. 1 illustrates a conventional quadrant of a typical 16 Mb SRAM. Although this design has been optimized for performance, the shaded blocks, labeled SUB0UL (upper-left) through SUB15LR (lower-right) represent 64 of the SRAM's 256 subarrays. Each subarray is a small independent memory structure, which contains all the sensing, precharge, and timing circuitry to access the contained memory elements. SRAM designs utilize the subarray structure to minimize the number of cells activated within any given cycle, thereby reducing the chips active power. For this design, only 2 of the 64 quadrant subarrays will be active in a cycle. The subarrays are designed using the standard dummy wordline and dummy bit technique as more fully described in U.S. Pat. Nos. 5,268,869, and 4,425,633 which are examples of this technique used for the past 15 years to precisely time the sensing circuitry. One benefit derived from this sensing method is an almost constant access time across the subarray, leaving only the subarray selection and common global data buses between subarrays that can generate an access delta between memory elements. In this case, we will compare an access delta between a slow subarray 11 and a fast subarray 19.

For the existing architecture, 11 is accessed by an address signal 1 that drives from the center of the chip through three sections of wire 2, 3 and 4 having a delay RC1 and the two re-buffers 5 and 6, before reaching the global wordline driver 7. The global wordline driver circuits decode the address and drive a global wordline signal across the array on a wire 9 with delay RC2. Due to the large array size, the global wordline is applied to rebuffer 10 before driving to 11 across another wire 12 having a delay RC12. Note that for simplicity this diagram only illustrates the selection of the subarray through the global wordline. In reality, the global wordline selects the subarray in conjunction with several column selection signals. It should be clear that the wiring and buffering of the column signal will be handled in a manner similar to the global wordline. Once selected, subarray 11 accesses its local memory cells and then drives data along a data bus 13 with delay RC3 through a data rebuffer circuit 14, along a second data bus 15 with delay RC4, through a second data rebuffer circuit 16, and finally a third data bus 17 having a delay RC5 before reaching the SRAM output drivers 18.

The fast subarray 19 is selected similarly, except in this case the addresses only need to travel through one section of wire of delay RC1 and the two rebuffers 5 and 8 before reaching the global wordline driver circuit 20. The global wordline drives through wire 21 with delay RC2 and selects subarray 19 without going through the global wordline rebuffer 23. Following the access to the subarray's local memory elements the data drives directly into the first data rebuffer circuit 22 and subsequently the second data rebuffer 16 without having additional wire delays. After the second stage rebuffer, the data travels along the data path of delay RC5 before reaching the output drivers 18.

To get a better appreciation for the timing differences between the fast and slow subarrays the following Table I translates the various delays discussed above to specific values, based on a typical 16 Mb SRAM design parameters.

TABLE I

| SUB0UL Access | Delay (ps) | SUB8LR Access | Delay (ps) | Access delta (ps) |
|---|---|---|---|---|
| RC1 + I0 | 83 | RC1 + I0 | 83 | 0 |
| RC1 + I2 + RC1 | 169 | I1 | 40 | 129 |
| Gw1Driver | 200 | Gw1Driver | 200 | 0 |
| RC2 | 56 | RC2 | 56 | 0 |
| Gw1buff + RC2 | 136 | | | 136 |
| Subdelay | 900 | Subdelay | 900 | 0 |
| RC3 | 56 | | | 56 |
| Data rebuff1 | 50 | Data rebuff1 | 50 | 0 |
| RC4 | 150 | | | 150 |
| Data rebuff2 | 50 | Data rebuff2 | 50 | 0 |
| RC5 | 40 | RC5 | 40 | 0 |
| Total | 1,890 | | 1,419 | 471 |

As shown in Table I, the total difference between accessing a fast and a slow subarray is 471 ps, or almost 25% of the products 2ns cycle. This timing difference (access delta) limits performance and complicates the design of a high performance SRAM device.

SUMMARY OF THE INVENTION

Accordingly, it is an object of the present invention to provide an architecture which will minimize the delays within each cell thereby allowing the cycle time to be reduced by preventing fast subarray accesses from colliding with the slower data from the more remote subarrays.

In accordance with the present invention, the architecture of the array is laid out to equalize access to all memory elements. To the greatest extent possible, the cells are located around the periphery as if on a rim of a wheel. With such an arrangement, the address signal is fed through the center of the array and propagates radially to the selected subarray. The data from the subarray will then follow a radial path back through the center of the array to the output drivers. In this way, the delays to the fastest and slowest subarray would have an access delta that is about the same.

DESCRIPTION OF PREFERRED EMBODIMENT

Figure 1:
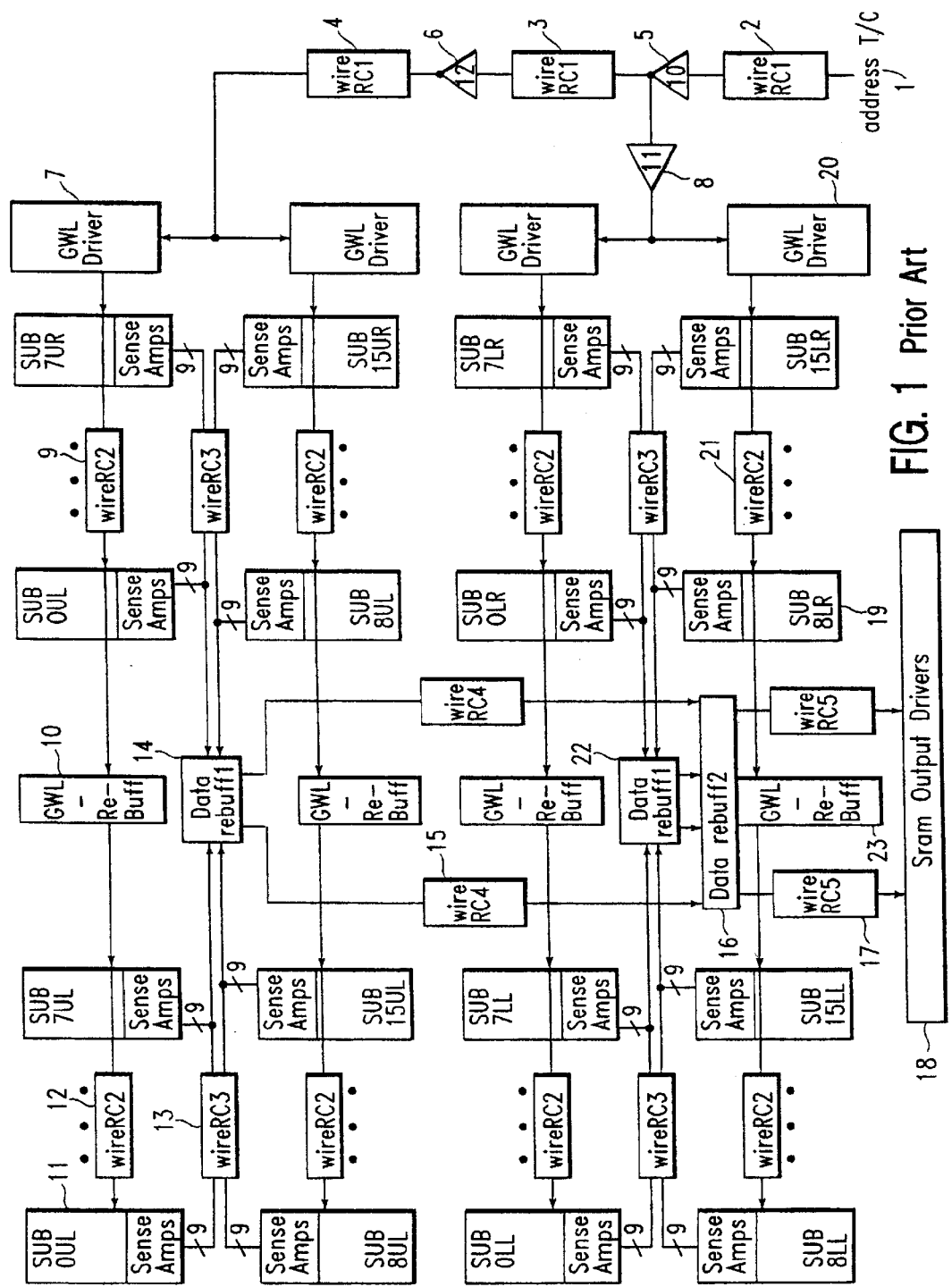
FIG. 1 is a schematic illustration of a conventional memory system.
Figure 2:
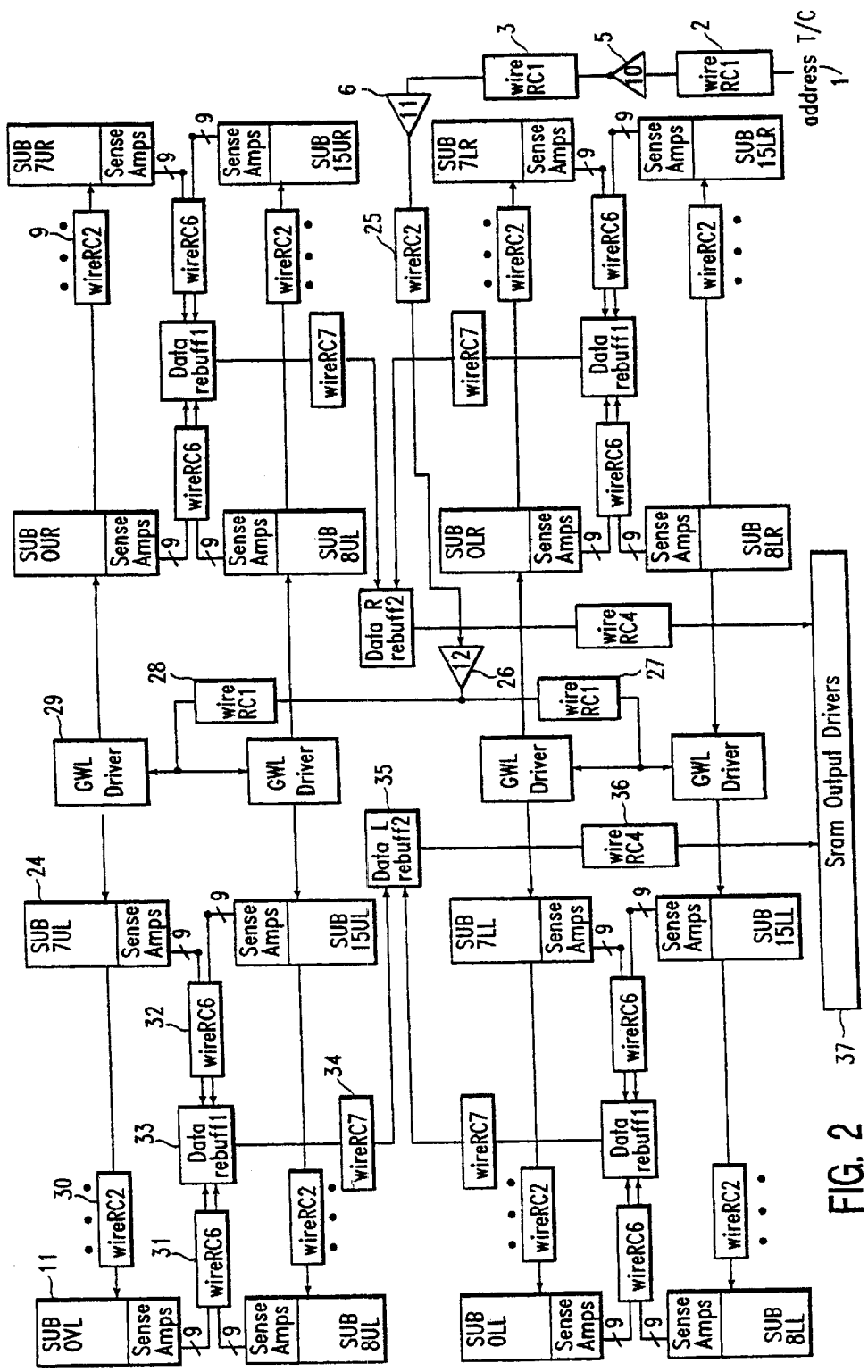
FIG. 2 is a schematic of a semiconductor memory system according to the present invention.

The primary intent of this SRAM architecture is to equalize access delta to all memory elements, much as if the memory cells were located an equal distance from the input. This becomes important for high performance SRAMs when cross-chip access deltas become greater than 10% of the products desired cycle time. The access deltas, or slope in the products timings, limit how fast the SRAM can be cycled by causing collisions when a fast memory location is accessed immediately following a slow location. The basic method proposed to equalize access delays is similar to that used in the design of a microprocessor's balanced clock tree, except in this case the balancing is performed on the address decode path and data path of a memory chip. For fast large memory designs, it is necessary to rebuffer signals as these wires traverse the chip by strategically positioning the components which cause the delay; such as, the rebuffers, data buffers, and drivers as well as using additional extra wire-tracks to "wire back" to the fast subarray. In this manner, a balanced access can be achieved as will be described as shown in FIG. 2 which is a block diagram of the improved architecture of the present invention. All of this will become apparent by comparing the access time of a slow subarray 11 and a fast subarray 24 as shown in FIG. 2. It is to be noted that similar reference numerals as used in FIG. 1 are used in FIG. 2 to desegregate corresponding elements for the sake of understanding. The memory is accessed when an address signal 1 drives from the center of the chip through two sections of wire 2 and 3 with a delay RC1 and two rebuffers 5 and 6. Note that the address does not stop at the first place that it can be used (the lower right memory subarrays), instead it drives right past it to the center point between the near and far sections of the memory, and then wires back. Once reaching the second rebuffer 6 the addresses are evenly wired to a strategically positioned global wordline drivers in the center of the array through a wire 25 having a delay RC2, a third address rebuffer 26, and the two wires 27 and 28 of equal delay RC1. By wiring the addresses and positioning the rebuffers and decoders as shown in this example, it is clear that all global wordline drivers on this large memory chip will provide approximately equal access time. Now there is no difference between the upper left section or the lower right, and any access delta will be contained within a 16 subarray group. From the global wordline driver the fast subarray 24 is immediately selected, while the slow subarray 11 is selected after the wire 30 with a delay RC2. To minimize the access delta in the 16 subarray group, the proposed architecture is extended to the memory data bus. Both fast and slow subarrays send their data down a data bus 31 and 32 having a delay RC6 to the first stage data rebuffer 33 which is repositioned to help balance the data path. From the first stage rebuffer 33 the data is sent to the second stage rebuffer 35 on a wire 34 having a delay RC7. Again, it should be noted that this wire goes back in the direction from which that data from subarray 24 came and requires additional space (wire tracks) or an additional level of metal. This is a good tradeoff to achieve the best performance. The second stage data rebuffer 35 is now positioned in the middle of the CRAM quadrant, allowing an equal data path from each of the four subarray groups (UL, UR, LL, LR). The second stage rebuffer then drives the data to the SRAM output drivers 37 along a wire 36 with a delay RC4.

The following Table II summarizes the various delays for the fast and slow subarrays discussed hereinbefore to specific values based on SRAM design parameters.

TABLE II

| SUB0UL Access | Delay (ps) | SUB7LR Access | Delay (ps) | Access delta (ps) |
|---|---|---|---|---|
| RC1 + I0 | 83 | RC1 + I0 | 83 | 0 |
| RC1 + I1 + RC2 | 169 | RC1 + I1 + RC2 | 163 | 0 |
| I2 + RC1 | 83 | I2 + RC1 | 83 | 0 |
| GWL Driver | 200 | GWL Driver | 200 | 0 |
| RC2 | 56 | | | 56 |
| Subdelay | 900 | Subdelay | 900 | 0 |
| RC6 | 29 | RC6 | 29 | 0 |
| Data rebuff1 | 50 | Data rebuff1 | 50 | 0 |
| RC7 | 120 | RC7 | 120 | 0 |
| Data rebuff2 | 50 | Data rebuff2 | 50 | 0 |
| RC4 | 150 | RC4 | 150 | 0 |
| Total | 1,890 | | 1,834 | 56 |

To summarize, the SRAM architecture proposed here significantly minimizes access deltas across a large memory array, thereby allowing the cycle time to be reduced by preventing fast subarray accesses from colliding with the slower data from the more remote subarrays. In this example, the cycle can be reduced by >400ps over the prior art architecture.

The memory system shown and described in connection with the above embodiment is preferred for use in a memory array of a high speed SRAM of a large capacity which may be used in a cache memory; for example, in which a high speed CPU and a high speed bus are directly coupled together in order to achieve a high speed operation compatible to the high speed CPU. However, this embodiment may be applicable to a high-speed semiconductor memory system of a large capacity other than SRAM; such as, Dynamic Random Access Memory (DRAM). In addition, it is to be noted that while the present invention has been disclosed above in connection with a preferred embodiment, it should be understood that the present invention has various forms of embodiments without departing from the spirit and the scope of the present invention.

What is claimed is:

1. A semiconductor memory array system having an input which receives an address signal and art output which transmits stored data comprising;

a plurality of subarrays having sense circuits, precharging circuits, timing circuits and memory elements arranged in a rectangular shaped matrix of rows and columns which stores data, wherein, addresses originate from a single location and are transmitted to a location central to all subarrays;

a plurality of wordline driver circuits located along the center line of the matrix which decode the address and drive a wordline signal within the subarray; and, a plurality of rebuffers receiving the address signal and transmitting it to the wordline driver and column select driver circuits to the selected subarray which accesses and transmits the data to a plurality of data rebuffers positioned in the middle of the matrix to transmit the data to the output whereby the access data from each subarray is about the same.

2. A semiconductor memory array system of claim 1, wherein, addresses at central location to all subarrays are driven equally to all global decode drivers.

3. A semiconductor memory array system of claim 1, wherein, memory subarrays are subdivided into memory sub-blocks.

4. A semiconductor memory array system of claim 3, wherein, data from each subarray in a memory sub-block is driven to a central location in the said memory sub-block.

5. A semiconductor memory array system of claim 4, wherein, data from the central location in each memory sub-block is driven to a location central to all memory sub-blocks and subsequently driven to a memory output driver.

* * * * *